United States Patent
Elhanati et al.

(10) Patent No.: US 7,746,965 B2
(45) Date of Patent: Jun. 29, 2010

(54) AUTOMATIC GAIN CONTROL FOR A WIDEBAND SIGNAL

(75) Inventors: Alon Elhanati, Tel-Aviv (IL); Liran Brecher, Kfar-Saba (IL); Naor Goldman, Moshav Ein-Vered (IL); Noam Tal, Tel-Aviv (IL); Shaul Klein, Herzlyia (IL)

(73) Assignee: Texas Instruments Incorporated, Dallas, TX (US)

( * ) Notice: Subject to any disclaimer, the term of this patent is extended or adjusted under 35 U.S.C. 154(b) by 569 days.

(21) Appl. No.: 11/772,461

(22) Filed: Jul. 2, 2007

(65) Prior Publication Data

US 2008/0181283 A1 Jul. 31, 2008

Related U.S. Application Data

(60) Provisional application No. 60/862,388, filed on Oct. 20, 2006.

(51) Int. Cl.
*H04L 27/08* (2006.01)
*H04B 1/16* (2006.01)
(52) U.S. Cl. .................................... 375/345; 455/234.1
(58) Field of Classification Search ................ 375/222, 375/316, 345; 455/136, 138, 232.1, 234.1, 455/245.1, 250.1; 330/254, 278; 725/95, 725/105, 110–111, 127, 148–149
See application file for complete search history.

(56) References Cited

U.S. PATENT DOCUMENTS

| | | | |
|---|---|---|---|
| 6,510,188 B1 * | 1/2003 | Isaksen et al. | 375/345 |
| 6,512,472 B1 | 1/2003 | Smith et al. | |
| 6,687,489 B1 | 2/2004 | Lapid | |
| 6,731,703 B2 * | 5/2004 | Kurihara | 375/345 |
| 7,023,868 B2 | 4/2006 | Rabenko et al. | |
| 7,483,500 B2 * | 1/2009 | Takatz et al. | 375/345 |
| 2002/0061012 A1 | 5/2002 | Thi et al. | |
| 2003/0172379 A1 | 9/2003 | Matsuura | |
| 2006/0225109 A1 | 10/2006 | Seo | |
| 2007/0086547 A1 * | 4/2007 | Sobchak et al. | 375/345 |
| 2007/0110193 A1 * | 5/2007 | Solum | 375/345 |
| 2009/0027119 A1 * | 1/2009 | Williams et al. | 330/149 |

* cited by examiner

*Primary Examiner*—Tesfaldet Bocure
*Assistant Examiner*—Lawrence B Williams
(74) *Attorney, Agent, or Firm*—Steven A. Shaw; W. James Brady; Frederick J. Telecky, Jr.

(57) ABSTRACT

One embodiment of the present invention includes a method for controlling a gain of a wideband signal. The method comprises adding a virtual channel to the wideband signal, the wideband signal comprising at least one channel. The method also comprises monitoring an output power associated with the wideband signal that includes the at least one channel and the virtual channel. The method further comprises setting a gain factor to achieve a predetermined output power of the wideband signal and amplifying the wideband signal based on the gain factor.

20 Claims, 3 Drawing Sheets

AUTOMATIC GAIN CONTROL FOR A WIDEBAND SIGNAL

This application claims priority to provisional application Ser. No. 60/862,388 filed Oct. 10, 2006.

TECHNICAL FIELD

This invention relates to electronic circuits, and more specifically to automatic gain control for a wideband signal.

BACKGROUND

In the constantly improving field of electronic communication, the demand for network communication has spread to a variety of different forms of communication media. As an example, communications over cable media is no longer implemented solely for video signal processing, but also includes voice and data communications, as well. The international standard Data Over Cable Service Interface Specifications (DOCSIS) has been developed to dictate, among a variety of other things, power levels for cable modems to efficiently process video, voice, and data signals. The DOCSIS standard is continually being updated to improve video, voice, and data signal transfer.

An incoming signal to a cable modem in a DOCSIS 3.0 system environment can be a wideband signal that can include a number of separate channels. Each of the channels can carry voice, video, or data information intended for one or more different devices on a given network. Certain channels within the wideband signal may have input power levels that differ relative to one another.

FIG. 1 illustrates an example of a diagram 10 of input power scenarios for a wideband signal, such as can be implemented in a DOCSIS 3.0 system. Each of the input power scenarios demonstrate a power amplitude of one or more channels plotted across frequency band. As an example, the frequency band can be approximately 102 MHz or more. The diagram 10 includes a first input power scenario 12 that demonstrates a single channel 22 within the frequency band. As an example, the single channel 22 can occupy approximately 6 MHz within the frequency band, and can have an input power of between approximately −20 dBmV and 20 dBmV. The single channel 22 can be a desired channel, such that it carries information intended for a device on the network to which it is provided via the cable modem. Because the wideband signal includes just the single channel 22, the input power of the single channel 22 is also the input power of the entire wideband signal.

The diagram 10 also includes a second input power scenario 14. The second input power scenario 14 includes a desired channel 24 and additional channels 26, demonstrated as three additional channels 26 in the example of FIG. 1. It is to be understood, however, that the second input power scenario 14 is not limited to four channels, the desired channel 24 and the additional channels 26, but is intended to demonstrate a manner of channels that occupy a bandwidth of less than the entire frequency band. In addition, in the second input power scenario 14, the desired channel 24 and the additional channels 26 are all demonstrated as having a substantially equal power amplitude. As an example, the desired channel 24 and the additional channels 26 can all have an input power of between approximately −20 dBmV and 20 dBmV, such that the wideband signal can have an input power of between approximately −14 dBmV and 26 dBmV.

The diagram 10 also includes a third input power scenario 16. The third input power scenario 16 includes a desired channel 28 and additional channels 30, demonstrated as three additional channels 30 in the example of FIG. 1, similar to the second input power scenario 14. Also similar to the second input power scenario 14, the third input power scenario 16 is intended to demonstrate a number of channels that occupy a bandwidth of less than the entire frequency band, and is thus not limited to four channels. The third input power scenario 16 depicts a scenario in which the desired channel 28 and the additional channels 30 have different input power amplitudes relative to each other. As an example, the desired channel 28 and the additional channels 30 can all have an input power of between approximately −20 dBmV and 20 dBmV, such that the wideband signal can have an input power of between approximately −5 dBmV and 35 dBmV.

The diagram 10 also includes a fourth input power scenario 18. The fourth input power scenario 18 includes a desired channel 32 and additional channels 34, demonstrated as sixteen additional channels 34 in the example of FIG. 1. In the fourth input power scenario 18, each of the desired channel 32 and the additional channels 34 can have a bandwidth of 6 MHz, such that the desired channel 32 and the additional channels 34 occupy substantially the entire frequency band of the wideband channel. In addition, in the fourth input power scenario 18, the desired channel 30 and the additional channels 32 are all demonstrated as having a substantially equal power amplitude. As an example, the desired channel 32 and the additional channels 34 can all have an input power of between approximately −20 dBmV and 20 dBmV, such that the wideband signal can have an input power of between approximately −8 dBmV and 32 dBmV.

Lastly, the diagram 10 includes a fifth input power scenario 20. The fifth input power scenario 20 includes a desired channel 36 and sixteen additional channels 38, similar to the fourth input power scenario 18, such that the desired channel 32 and the additional channels 34 occupy substantially the entire frequency band of the wideband channel. However, similar to the third input power scenario 16, the desired channel 36 and the additional channels 38 have different input power amplitudes relative to each other. As an example, the desired channel 36 and the additional channels 38 can all have an input power of between approximately −20 dBmV and 20 dBmV, such that the wideband signal can have an input power of between approximately −2 dBmV and 36 dBmV. The fifth input power scenario 20 may be considered a worst-case scenario, as the desired channel 36 can have a power amplitude that is significantly less than the additional channels 38 (e.g., 10 dB).

In order to ensure that the desired channel of a given wideband signal is properly amplified, such that it can be demodulated and processed to receive the information therein, a cable modem may include an automatic gain controller (AGC). The AGC may configured to amplify the input wideband signal, such that the desired channel therein is amplified to an appropriate power amplitude for processing. However, there a number of constraints that may require consideration in developing an algorithm for the operation of the AGC, such as interferer channel leaping that can cause undesirable clipping, and dynamic power range that can affect quantization noise.

One such example of an AGC algorithm may account for a worst-case input power scenario by amplifying the wideband signal such that the channel having the lowest power amplitude is set at a predetermined amplitude (e.g., 20 dBmV). This algorithm benefits from having a more static operation of the AGC, as well as having a relatively lower dynamic power range for the cable signal tuner (e.g., 0-40 dB). However, this algorithm may undesirably boost the additional channels relative to the desired channel, and may not be able to provide protection from inband out-of-DOCSIS impairments, such that a wideband signal in any of the additional input power scenarios 12, 14, 16, and 18 may not optimally amplify the respective desired signal, 22, 24, 28, and 32.

Another example of as AGC algorithm may amplify the wideband signal such that the total amplified wideband signal power amplitude is set for a fixed, predetermined value. As an example, a given AGC may be limited by a total amount of received power of an input wideband signal. As a result, the amplified wideband signal power amplitude can be set to a potential that is approximately at or near an average signal power corresponding to the maximum power capability of the AGC. This algorithm is beneficial in that it more optimally amplifies the desired signal in all of the input power scenarios 12, 14, 16, 18, and 20. However, this algorithm results in rapid changes in the operation of the AGC and an undesirably high dynamic power range for the cable signal tuner (e.g., 6-62 dB). In addition, this AGC algorithm affords little to no protection for interferer channel leaping, such as when a given one of the channels unexpectedly increases in power amplitude. As a result, clipping of the wideband signal may occur as the power of the wideband signal may become too great in amplitude.

SUMMARY

One embodiment of the present invention includes a method for controlling a gain of a wideband signal. The method comprises adding a virtual channel to the wideband signal, the wideband signal comprising at least one channel. The method also comprises monitoring an output power associated with the wideband signal that includes the at least one channel and the virtual channel. The method further comprises setting a gain factor to achieve a predetermined output power of the wideband signal and amplifying the wideband signal based on the gain factor.

Another embodiment of the present invention includes an automatic gain controller. The automatic gain controller comprises an analog-to-digital converter (ADC) configured to receive a wideband signal output from a programmable gain amplifier and to generate digital samples of the wideband signal. The wideband signal can include at least one channel. The automatic gain controller also comprises a wideband signal power monitor configured to monitor an output power associated with the digital samples of the wideband signal. The automatic gain controller further comprises a gain controller configured to provide a gain command to the programmable gain amplifier based on both an output power of the at least one channel of the wideband signal and a power of a virtual channel.

Another embodiment of the present invention includes a system for controlling a gain of a wideband signal that includes at least one channel. The system comprises means for amplifying the wideband signal based on a gain command and means for generating a virtual channel and adding the virtual channel to the amplified wideband signal. The system also comprises means for detecting a power of the wideband signal including the virtual channel and means for generating the gain command to set the power of the wideband signal including the virtual channel to a predetermined output power.

DETAILED DESCRIPTION

Figure 1:
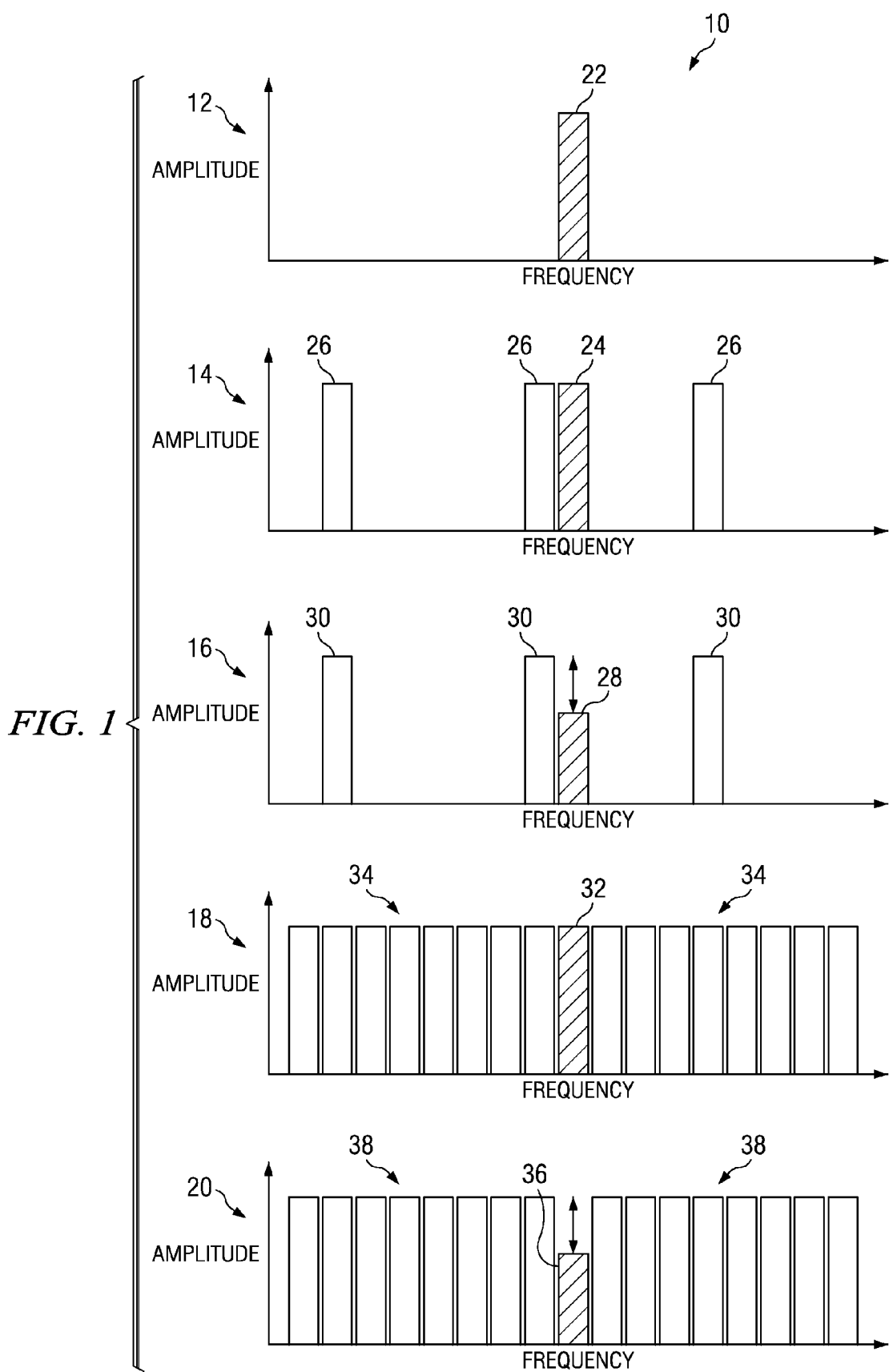
FIG. 1 illustrates an example of a diagram of input power scenarios for a wideband signal.

The present invention relates to electronic circuits, and more specifically to automatic gain control for a wideband signal. An automatic gain controller (AGC) receives an amplified input wideband signal that includes at least one channel. The AGC converts the wideband signal into digital samples and adds a virtual channel to the wideband signal. The virtual channel can be generated from filtering the wideband signal to select a channel that is a desired channel and/or a channel having the least power amplitude. The selected channel can be amplified and added to the wideband signal. The power amplitude of the wideband signal, including the virtual channel, is monitored to set a gain factor of a programmable gain amplifier at the input of the AGC. The input wideband signal is thus amplified based on the gain factor. As a result, the wideband signal can provide optimal gain to the desired channel in any of the gain scenarios 12, 14, 16, 18, and 20 in the example of FIG. 1, can provide adequate dynamic power range to the cable tuner, and has protection from interferer channel leaping.

Figure 2:
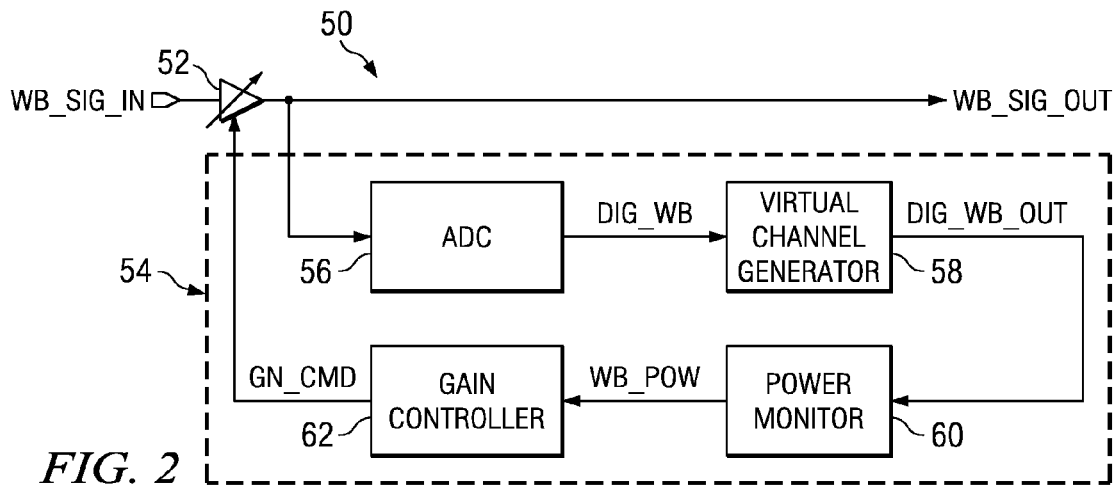
FIG. 2 illustrates an example of a system for controlling the gain of a wideband signal in accordance with an aspect of the invention.

FIG. 2 illustrates an example of a system 50 for controlling the gain of a wideband signal in accordance with an aspect of the invention. The system 50 demonstrates a wideband signal WB_SIG_IN that can include at least one channel being input to the system 50. The wideband signal WB_SIG_IN can be a cable signal that has been downsampled, such that it may be an intermediate frequency (IF) signal downsampled from a radio frequency (RF) signal, that adheres to a DOCSIS system standard (e.g., DOCSIS 3.0), and can include any combination of video, voice, and data information. The wideband signal WB_SIG_IN can have an input power and channel arrangement that can be represented by any of the input power scenarios 12, 14, 16, 18, and 20 demonstrated in the example of FIG. 1, as demonstrated in greater detail below.

The wideband signal WB_SIG_IN is provided to a programmable gain amplifier (PGA) 52. The PGA 52 is configured to amplify the wideband signal WB_SIG_IN to generate an amplified output wideband signal WB_SIG_OUT based on a programmable gain factor that is set by a gain command signal GN_CMD. The output wideband signal WB_SIG_OUT can be provided to a demodulator and/or other signal processing equipment, such as a cable tuner. In addition, the output wideband signal WB_SIG_OUT is provided to an automatic gain controller (AGC) 54. The AGC 54 includes an analog-to-digital converter (ADC) 56 configured to convert the output wideband signal WB_SIG_OUT into digital samples, demonstrated in the example of FIG. 2 as digital samples DIG_WB. Therefore, the digital samples DIG_WB are merely a repeatedly sampled digital representation of the wideband signal WB_SIG_OUT. As such, it is to be understood that the term "wideband signal" may also be used to describe the digital samples DIG_WB, as used herein.

The digital samples DG_WB of the wideband signal are output from the ADC 56 and provided to a virtual channel generator 58. The virtual channel generator 58 is configured to add a virtual channel to the at least one channel that is included in the wideband signal WB_SIG_OUT. As an example, the virtual channel can be an additional channel that is generated and added to the wideband signal WB_SIG_OUT solely for a power calculation of the wideband signal WB_SIG_OUT to set the gain factor in the gain command signal GN_CMD, as explained in greater detail below. For example, the virtual channel can be set at a power amplitude of 10 dB greater than the lowest bonded channel (e.g., desired channel) in the wideband signal WB_SIG_OUT. Specifically, in the event that there is only a single desired channel in the wideband signal WB_SIG_OUT, the virtual channel, generator 58 can extract the desired channel, amplify the desired channel, and add it back into the wideband signal. In the event that there are multiple desired channels, the virtual channel generator 58 can extract all of the desired channels, select the channel that has the lowest power amplitude, amplify the selected channel, and add it back into the wideband signal. As a result, the virtual channel generator 58 outputs digital samples of the wideband signal, demonstrated in the example of FIG. 2 as DIG_WB_OUT, that each include the added virtual channel.

The digital samples DIG_WB_OUT are sequentially output from the virtual channel generator 58 and are provided to a power monitor 60. The power monitor 60 is configured to determine a power amplitude of each of the received digital samples DIG_WB_OUT. The power of the digital samples DIG_WB_OUT is provided as a signal WB_POW to a gain controller 62. The gain controller 62 is configured to compare the power of each of the digital samples DIG_WB_OUT, as communicated via the signal WB_POW, with a predetermined power amplitude, which can be stored as a digital word within the gain controller. The predetermined power amplitude can be a desired power amplitude for the amplified wideband signal WB_SIG_OUT, and can be based on limitations imposed by the AGC 54. For example, the ADC 56 may be limited to providing samples of an analog signal that is no greater than 1 volt peak-to-peak (i.e., 54 dBmV peak voltage). As an example, the wideband signal WB_SIG_OUT can have a peak-to-average ratio of 12 dB. Therefore, the predetermined power amplitude can be 54−12=42 dBmV.

The gain controller thus sets the gain factor based on the comparison and communicates the gain factor to the PGA 52 via the signal GN_CMD. For example, if the power amplitude of a given one of the digital samples DIG_WB_OUT is greater than the predetermined power amplitude, the gain controller 62 sets the gain factor to reduce the amplification of the PGA 52. Alternatively, if the power amplitude of a given one of the digital samples DIG_WB_OUT is less than the predetermined power amplitude, the gain controller 62 sets the gain factor to increase the amplification of the PGA 52. However, because the gain controller 62 sets the gain factor based on power measurements of the digital samples DIG_WB_OUT that include the virtual channel, the gain controller 62 sets the gain factor to a value that can be less than a gain factor set for the same wideband signal WB_SIG_OUT that does not include the virtual channel. In other words, by including the virtual channel in the power measurement of the digital samples DIG_WB_OUT, the gain factor is set such that the wideband signal WB_SIG_OUT is amplified at a power amplitude that includes a back-off margin from the predetermined power amplitude. As a result, the wideband signal WB_SIG_OUT is better protected from interferer channel leaping that can cause clipping and has an acceptable dynamic range while still optimally amplifying the desired channel of the wideband signal WB_SIG_OUT in any of the input power scenarios 12, 14, 16, 18, and 20 described above in the example of FIG. 1.

It is to be understood that the gain control system 50 is not intended to be limited to the example of FIG. 2. As an example, the power monitor 60 can be configured to monitor the power amplitude of the digital samples DIG_WB output from the ADC 56, prior to the addition of the virtual channel. Thus, the gain controller 62 can incorporate the virtual channel generator 58, such that it includes the virtual channel power information in the power calculation based on the power amplitude of the digital samples DIG_WB output front the ADC 56 via the power monitor 60. In addition, the gain command signal GN_CMD may be provided to one or more additional PGAs aside from the PGA 52, such as a PGA configured to amplify an RF version of the wideband signal prior to downsampling to generate the wideband signal WB_SIG_IN. Furthermore, it is to be understood that the AGC 54 is depicted to demonstrate only relevant components for simplicity, but that the AGC 54 can include any of a variety of additional components. Therefore, the gain control system 50 can be configured in any of a variety of different ways.

Figure 3:
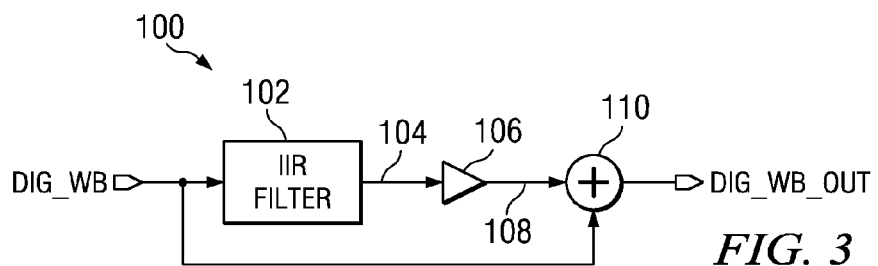
FIG. 3 illustrates an example of a virtual channel generator in accordance with an aspect of the invention.

FIG. 3 illustrates an example of a virtual channel generator 100 in accordance with an aspect of the invention. The virtual channel generator 100 can be implemented in the gain control system 50 in the example of FIG. 2, such that it can be configured substantially similar to the virtual channel generator 58. As such, reference will be made to the example of FIG. 2 in the discussion of FIG. 3.

The virtual channel generator 100 receives the digital samples DIG_WB of the wideband signal. The digital samples DIG_WB are provided to an infinite-impulse response (IIR) filter 102. The IIR filter 102 can be tuned to the desired channel of the wideband signal WB_SIG_OUT, such that the IIR filter 102 is configured to extract the desired channel from the digital samples DIG_WB. Thus, the IIR filter 102 outputs the desired channel, demonstrated in the example of FIG. 3 at 104. The desired channel 104 is then provided to an amplifier 106 configured to apply a fixed gain, such as 10 dB. As a result, the extracted desired channel 104 is amplified to generate the virtual channel, demonstrated in the example of FIG. 3 at 108.

The virtual channel 108 and the digital samples DIG_WB are each provided to an adder 110. The adder 110 is thus configured to add the virtual channel 108 to each respective one of the digital samples DIG_WB of the wideband signal. Thus, the virtual channel 108 is added to the wideband signal, despite the virtual channel 108 merely being an amplified reproduction of the desired channel. The adder 110 outputs the digital samples DIG_WB_OUT that each include the virtual channel 108. The digital samples DIG_WB_OUT can then be provided directly to a power monitor, such as the power monitor 60 in the example of FIG. 2, or can first be amplified, such as via a near unity gain amplifier, to account for losses that may have occurred in the generation and addition of the virtual channel 108.

Figure 4:
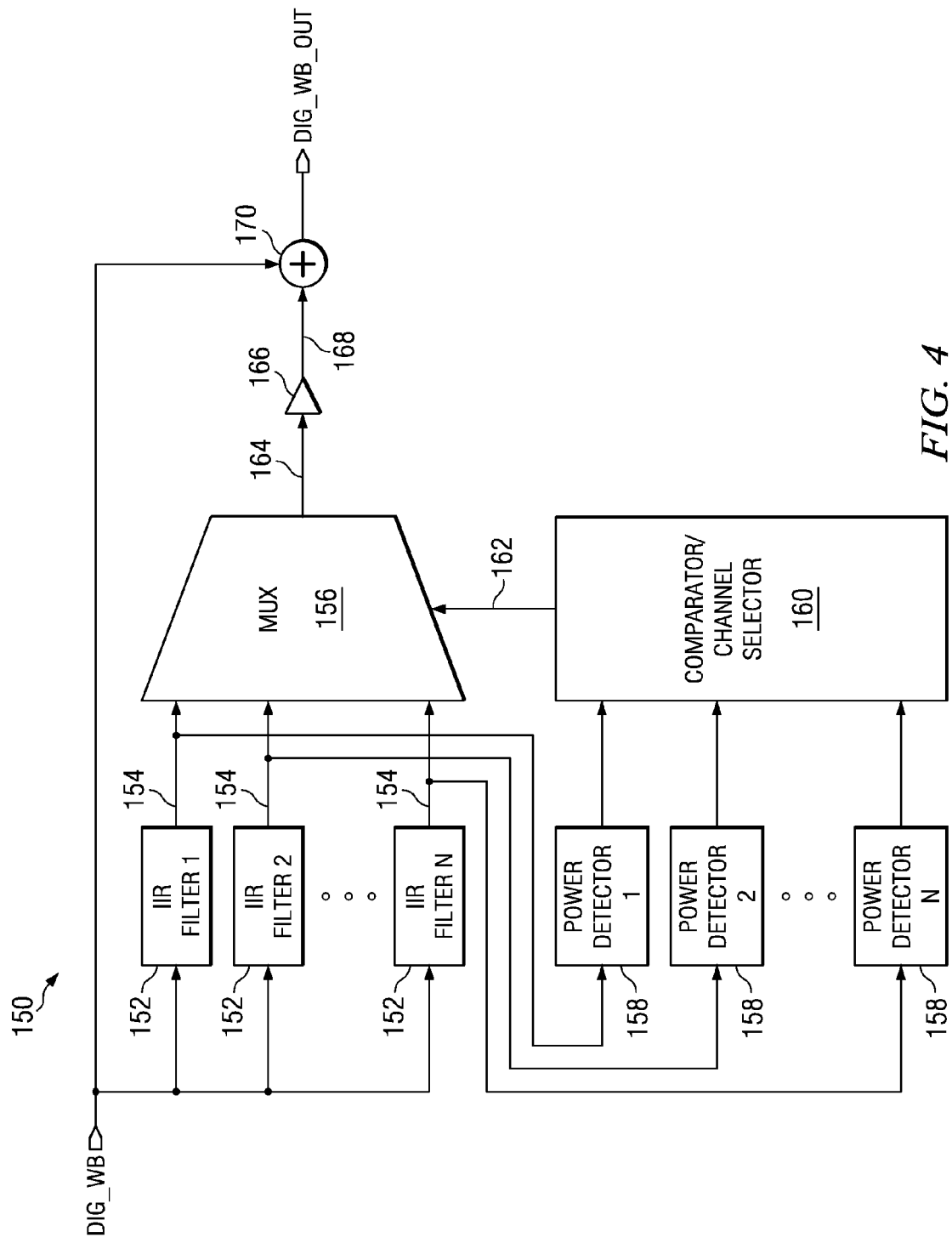
FIG. 4 illustrates another example of a virtual channel generator in accordance with an aspect of the invention.

FIG. 4 illustrates another example of a virtual channel generator 150 in accordance with an aspect of the invention. The virtual channel generator 150 can be implemented in the gain control system 50 in the example of FIG. 2, such that it can be configured substantially similar to the virtual channel generator 58. As such, reference will be made to the example of FIG. 2 in the discussion of FIG. 4.

The virtual channel generator 150 receives the digital samples DIG_WB of the wideband signal. The digital samples DIG_WB are provided to a plurality IIR filters 152, numbered 1 through N in the example of FIG. 4, where N is a positive integer. Each of the IIR filters 152 can be tuned to separate channels of the wideband signal, such that the IIR filters 152 are configured to extract the respective channels from the digital samples DIG_WB, demonstrated in the example of FIG. 4 at 154. As an example, the cable modem in which the gain control system 50 of the example of FIG. 2 is implemented may have more than one desired channel. As such, the IIR filters 152 can each be tuned to separate ones of the desired channels. As another example, the virtual channel generator 150 can include a number of IIR filters 152 corresponding to the number of total channels within the wideband signal, such that each of the IIR filters 152 is tuned to a separate one of the channels of the wideband signal.

Each of the extracted channels of the digital samples DIG_WB are input to a multiplexer (MUX) 156. In addition, each of the extracted channels are also provided to a respective plurality of power detectors 158. Each of the power detectors 158 are configured to measure the power amplitude of each of the extracted channels. The power detectors 158 output the measured power of each of the respective extracted channels to a comparator/channel selector 160. The comparator/channel selector 160 is configured to compare the power amplitudes of each of the extracted channels, and to provide a channel selection signal 162 to the MUX 156 corresponding to the extracted channel having the lowest power amplitude. Therefore, the MUX 156 switches its output to a selected channel 164 that is the specific extracted channel that has the lowest power amplitude based on the channel selection signal 162.

The selected channel 164 is output from the MUX 156 and provided to an amplifier 166 that is configured to apply a fixed gain, such as 10 dB. As a result, the selected channel 164 is amplified to generate the virtual channel, demonstrated in the example of FIG. 4 at 168. The virtual channel 168 and the digital samples DIG_WB are each provided to an adder 170 configured to add the virtual channel 168 to each respective one of the digital samples DIG_WB of the wideband signal. Thus, the virtual channel 168 is added to the wideband signal, despite the virtual channel 168 merely being an amplified reproduction of the desired channel. The adder 168 outputs the digital samples DIG_WB_OUT that each include the virtual channel 168. The digital samples DIG_WB_OUT can then be provided directly to a power monitor, such as the power monitor 60 in the example of FIG. 2, or can first be amplified, such as via a near unity gain amplifier, to account for losses that may have occurred in the generation and addition of the virtual channel 168, such as switching losses in the MUX 156.

As a result of the generation and addition of a virtual channel to the wideband signal, the AGC algorithm of the gain control system 50 can set the gain factor of the PGA 52 to a value that can be less than a gain factor set for the same wideband signal that does not include the virtual channel. Specifically, the power measurement of the wideband signal that includes the virtual channel creates a back-off margin from the predetermined power amplitude that allows for interferer channel leaping to occur without causing clipping of the wideband signal. In addition, the amplification of the wideband signal that includes the virtual channel results in an acceptable dynamic range while still optimally amplifying the desired channel of the wideband signal WB_SIG_OUT in any of the input power scenarios 12, 14, 16, 18, and 20 described above in the example of FIG. 1. This is better demonstrated with regard to TABLE 1 below:

TABLE 1

Amplification of the Wideband Signal including the Virtual Channel

| Input Power Scenario (FIG. 1) | Lowest Channel Input Power (dBmV) | Wideband Signal Input Power (dBmV) | Lowest Channel Output Power (dBmV) | Highest Channel Output Power (dBmV) | Wideband Signal Output Power (dBmV) | Total Gain (dB) |
| --- | --- | --- | --- | --- | --- | --- |
| 12 | −20-20 | −20-20 | 32 | 32 | 32 | 52-12 |
| 14 | −20-20 | −14-26 | 31 | 31 | 37 | 51-11 |
| 16 | −20-20 | −5-35 | 26 | 36 | 41 | 46-6 |
| 18 | −20-20 | −8-32 | 30 | 30 | 42 | 50-10 |
| 20 | −20-14 | −2-36 | 20 | 30 | 42 | 40-6 |

In the discussion of TABLE 1, Input Power refers to the power amplitude of the respective channel or wideband signal at the input of the PGA 52, and Output Power refers to the power amplitude of the respective channel or wideband signal output from the PGA 52. Thus, Total Gain is an indication of the amount of gain provided by the PGA 52. As demonstrated by TABLE 1, by adding the virtual channel to the wideband signal for the power calculation to set the gain of the PGA 52, the gain control system 50 has a dynamic power range for the cable signal tuner of 6-52 dB, which is substantially improved over a typical algorithm that sets the gain to achieve a predetermined output power. In addition, the operation of the gain control system 50 can be more static than the typical algorithm that sets the gain to achieve a predetermined output power, but can still provide better amplification of the desired channel in the non-worst case input power scenarios (e.g., Input Power Scenarios 12, 14, 16, and 18). Furthermore, as described above, the gain control system 50 has better protection from the effects of interferer channel leaping, particularly in the input power scenarios 12, 14, and 16, as the Wideband Signal Output Power does not achieve the maximum average input power capability of the ADC 56, demonstrated in the example of TABLE 1 as 42 dBmV.

Figure 5:
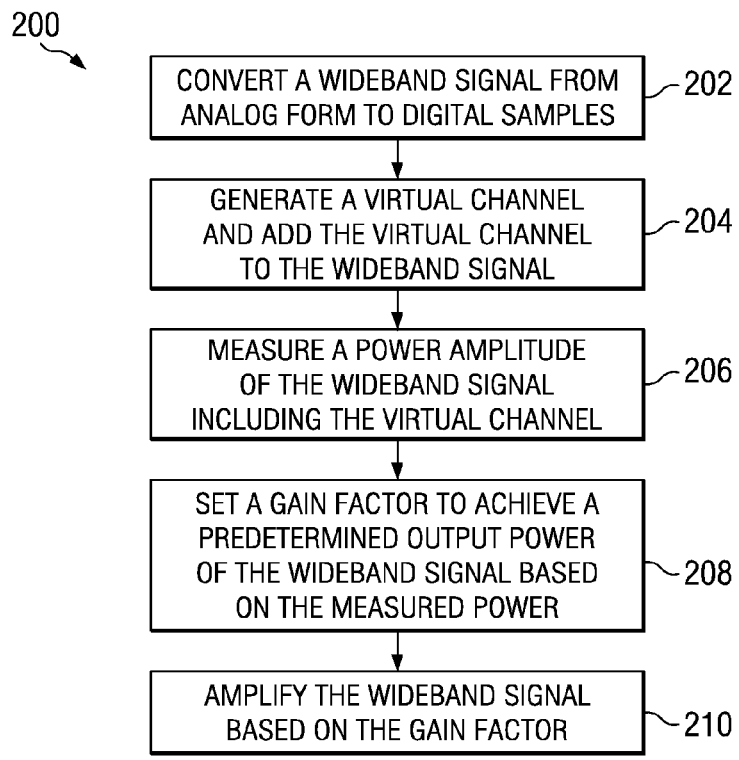
FIG. 5 illustrates an example of a method for controlling the gain of a multi-channel wideband signal in accordance with an aspect of the invention.

In view of the foregoing structural and functional features described above, certain methods will be better appreciated with reference to FIG. 5. It is to be understood and appreciated that the illustrated actions, in other embodiments, may occur in different orders and/or concurrently with other actions. Moreover, not all illustrated features may be required to implement a method. It is to be further understood that the following methodologies can be implemented in hardware (e.g., analog or digital circuitry, such as may be embodied in an application specific integrated circuit or a computer system), software (e.g., as executable instructions stored on a computer readable media or running on one or more computer systems), or any combination of hardware and software.

FIG. 5 illustrates an example of a method 200 for controlling the gain of a multi-channel wideband signal in accordance with an aspect of the invention. At 202, a wideband signal is converted from an analog form to digital samples. The wideband signal can be an incoming DOCSIS system (e.g., DOCSIS 3.0) input signal that includes video, voice, and/or data information. The wideband signal may have been downsampled, such that it may be an IF signal downsampled from an RF signal. The analog-to-digital conversion can occur based on the operation of an ADC.

At 204, a virtual channel is generated and added to the wideband signal. The virtual channel can be generated by extracting a desired channel or a channel having the lowest power from the wideband signal. The extracted desired channel or lowest power channel can be amplified by a predetermined gain (e.g., 10 dB) before being added back into the wideband signal to generate the virtual channel. At 206, a power amplitude of the wideband signal including the virtual channel is measured. A power detector could receive each digital sample and provide a power information signal to a gain controller.

At 208, a gain factor is set to achieve a predetermined output power of the wideband signal based on the measured power. The gain factor can be set by comparing the measured power with the predetermined output power. The predetermined output power can be an average power that is associated with a maximum input power of an ADC. At 210, the wideband signal is amplified based on the gain factor. The amplification of the wideband signal can occur at at least one PGA, such as a PGA for the downsampled IF frequency wideband signal and an upstream PGA for the RF frequency wideband signal.

What have been described above are examples of the present invention. It is, of course, not possible to describe every conceivable combination of components or methodologies for purposes of describing the present invention, but one of ordinary skill in the art will recognize that many further combinations and permutations of the present invention are possible. Accordingly, the present invention is intended to embrace all such alterations, modifications, and variations that fall within the spirit and scope of the appended claims.

What is claimed is:

1. A method for controlling a gain of a wideband signal, the method comprising:
    adding a virtual channel to the wideband signal, the wideband signal comprising at least one channel;
    measuring an output power associated with the wideband signal that includes the at least one channel and the virtual channel;
    setting a gain factor to achieve a predetermined output power of the wideband signal based on the measured output power; and
    amplifying the wideband signal based on the gain factor.

2. The method of claim 1, wherein adding the virtual channel comprises amplifying a desired channel of the at least one channel by a predetermined gain.

3. The method of claim 2, wherein adding the virtual channel further comprises adding the amplified desired channel into the wideband signal.

4. The method of claim 2, further comprising providing the wideband signal to an infinite impulse-response (IIR) filter that is tuned to extract the desired channel of the at least one channel from the wideband signal.

5. The method of claim 1, wherein the at least one channel of the wideband signal comprises a plurality of channels of the wideband signal, and wherein adding the virtual channel comprises:
    determining a respective channel of the plurality of channels having a lowest output power; and
    amplifying the respective channel by a predetermined gain.

6. The method of claim 5, wherein determining the respective channel comprises filtering the wideband signal to extract each of the plurality of channels and measuring an output power associated with each of the plurality of channels.

7. The method of claim 6, further comprising multiplexing the plurality of channels based on the measured output power to select the respective channel.

8. The method of claim 1, wherein setting the gain factor comprises setting the gain factor to achieve a predetermined output power that is an average power associated with an input to a analog-to-digital converter (ADC).

9. An automatic gain controller configured to implement the method of claim 1.

10. An automatic gain controller comprising:
    an analog-to-digital converter (ADC) configured to receive a wideband signal output from a programmable gain amplifier and to generate digital samples of the wideband signal, the wideband signal including at least one channel;
    a wideband signal power monitor configured to monitor an output power associated with the digital samples of the wideband signal; and
    a gain controller configured to provide a gain command to the programmable gain amplifier based on both an output power of the at least one channel of the wideband signal and a power of a virtual channel.

11. The automatic gain controller of claim 10, wherein the gain command comprises a gain factor configured to achieve a predetermined output power of the wideband signal that is an average power associated with the ADC.

12. The automatic gain controller of claim 10, further comprising a virtual channel generator configured to generate and add the virtual channel to the at least one channel of the wideband signal.

13. The automatic gain controller of claim 12, wherein the virtual channel generator is further configured to amplify a desired channel of the at least one channel by a predetermined gain and to add the amplified desired channel into the wideband signal to generate the virtual channel.

14. The automatic gain controller of claim 13, wherein the virtual channel generator comprises an infinite impulse-response (IIR) filter configured to filter the wideband signal to extract the desired channel of the at least one channel of the wideband signal.

15. The automatic gain controller of claim 12, wherein the at least one channel of the wideband signal comprises a plurality of channels of the wideband signal, and wherein the virtual channel generator comprises:
    a plurality of filters configured to extract the respective plurality of channels from the wideband signal;
    a plurality of power monitors configured to detect a power associated with each of the respective plurality of channels; and
    a comparator configured to determine a respective channel of the plurality of channels having a lowest power.

16. The automatic gain controller of claim 15, wherein the virtual channel generator further comprises:
    a multiplexer configured to select the respective channel having the lowest power based on an output of the comparator;
    an amplifier configured to amplify the respective channel by a predetermined gain; and
    an adder configured to add the amplified respective channel into the wideband signal to generate the virtual channel.

17. A system for controlling a gain of a wideband signal that includes at least one channel, the system comprising:
    means for amplifying the wideband signal based on a gain command;
    means for generating a virtual channel and adding the virtual channel to the amplified wideband signal;
    means for detecting a power of the wideband signal including the virtual channel; and means for generating the gain command to set the power of the wideband signal including the virtual channel to a predetermined output power.

18. The system of claim 17, wherein the means for generating the virtual channel comprises:
   means for selecting a respective channel of the at least one channel of the wideband signal; and
   means for amplifying the respective channel by a predetermined gain amount.

19. The system of claim 18, wherein the means for selecting comprises:
   means for detecting a power associated with each of the at least one channel; and
   means for comparing the power associated with each of the at least one channel, the respective channel having a lowest power.

20. The system of claim 18, wherein the means for generating the virtual channel further comprises means for adding the amplified respective channel to the wideband signal.

* * * * *